US007198403B2

(12) United States Patent
Pröll et al.

(10) Patent No.: US 7,198,403 B2
(45) Date of Patent: Apr. 3, 2007

(54) ARRANGEMENT FOR DETERMINING A TEMPERATURE LOADING OF AN INTEGRATED CIRCUIT AND METHOD

(75) Inventors: Manfred Pröll, Dorfen (DE); Jürgen Auge, Unterhaching (DE); Stephan Schröder, München (DE); Thomas Huber, München (DE)

(73) Assignee: Infineon Technologies AG, Munich (DE)

( * ) Notice: Subject to any disclaimer, the term of this patent is extended or adjusted under 35 U.S.C. 154(b) by 112 days.

(21) Appl. No.: 11/009,969

(22) Filed: Dec. 10, 2004

(65) Prior Publication Data

US 2005/0226309 A1     Oct. 13, 2005

(30) Foreign Application Priority Data

Dec. 12, 2003 (DE) ............................... 103 58 357

(51) Int. Cl.
 *G01K 7/00* (2006.01)
(52) U.S. Cl. ....................................... 374/178; 374/170
(58) Field of Classification Search ................ 374/178, 374/170
See application file for complete search history.

(56) References Cited

U.S. PATENT DOCUMENTS

| 4,972,099 | A | * | 11/1990 | Amano et al. ............... 382/313 |
| 5,180,440 | A | * | 1/1993 | Siegel et al. ................. 228/103 |
| 5,444,637 | A | | 8/1995 | Smesny et al. |

(Continued)

FOREIGN PATENT DOCUMENTS

JP        58225328 A   * 12/1983

OTHER PUBLICATIONS

Miura, H., et al., "Temperature Distribution in IC Plastic Packages in the Reflow Soldering Process," IEEE Transactions on Components, Hybrids and Manufacturing Technology, vol. 11, No. 4, Dec. 1988, pp. 499-505.

(Continued)

*Primary Examiner*—Diego Gutierrez
*Assistant Examiner*—Mirellys Jagan
(74) *Attorney, Agent, or Firm*—Slater & Matsil, L.L.P.

(57) ABSTRACT

In an arrangement for determining a temperature loading during a soldering process, a semiconductor chip (1) comprises at least one contact (2) to be soldered or is electrically conductively connected to at least one contact (14*d*) to be soldered that is situated outside the semiconductor chip. The semiconductor chip (1) furthermore comprises a temperature sensor device (3), which determines a measurement quantity corresponding to the temperature. A processing device (4, 5) has an analog-to-digital converter (5), which is electrically conductively connected to the temperature sensor device (3) and converts the measurement quantity into at least one storable signal that represents the temperature loading. A voltage supply device (10), which is electrically conductively connected to the temperature sensor device (3) and the processing device (4, 5), supplies these components with an operating voltage. A data memory (6) serves for storing the at least one storable signal. An electrical line (7, 11) connected to the data memory (6) serves for outputting the stored signal. As a result, it is possible to monitor temperature loadings of the semiconductor chip also outside the sphere of influence of the semiconductor manufacturer.

24 Claims, 2 Drawing Sheets

U.S. PATENT DOCUMENTS

| | | | |
|---|---|---|---|
| 5,751,015 A | | 5/1998 | Corbett et al. |
| 5,971,249 A | * | 10/1999 | Berkin ........................ 228/102 |
| 6,005,500 A | | 12/1999 | Gaboury et al. |
| 6,206,265 B1 | * | 3/2001 | Yamaoka .................... 228/103 |
| 6,630,754 B1 | | 10/2003 | Pippin |

OTHER PUBLICATIONS

Plattner, L., et al., "In-Situ Measurement of Chip Temperature During Soft Solder Die Bonding Using Integrated Microsensors," 1999 International Symposium on Microelectronics, pp. 213-220.

* cited by examiner

ARRANGEMENT FOR DETERMINING A TEMPERATURE LOADING OF AN INTEGRATED CIRCUIT AND METHOD

This application claims priority to German Patent Application 103 58 357.2, which was filed Dec. 12, 2003, and is incorporated herein by reference.

TECHNICAL FIELD

The present invention relates to an arrangement for determining a temperature loading of an integrated circuit, in particular caused by a soldering process. The invention additionally relates to an operating method for such an arrangement.

BACKGROUND

During the production of semiconductor components such as, by way of example, memory chips, in particular DRAM memories ("dynamic random access memories"), the individual integrated circuits are firstly produced at the wafer level and then singulated into semiconductor chips. After singulation, the functional chips are fitted in suitable housings, contact-connected and encapsulated. Afterward, the encapsulated chips, for producing a memory module, are applied to a module board and soldered thereto. Equally, it is also possible for a plurality of encapsulated or non-encapsulated chips to be soldered on one another. Sometimes, rework soldering steps are additionally carried out on the finished module.

Accordingly, the semiconductor components undergo a multiplicity of temperature-critical process steps on the way from the semiconductor chip to the finished component. Since the temperature-critical process steps during soldering can lead to parameter alterations in the individual semiconductor chips, for example to an alteration of the retention time in the case of DRAM memory chips, the maximum soldering temperature and also the soldering profile are specified precisely. The retention time is that time during which the information stored in a memory cell is retained in recognizable fashion.

In this case, the problem arises, on the one hand, that the temperature loading actually acting on the semiconductor chip cannot be determined exactly. Although the temperature of the soldering tip can be determined, it is not readily possible to demonstrate what temperature the chip itself experiences. Many of the soldering steps after production of the individual semiconductor chip may also be carried out outside the responsibility of the chip manufacturer, for example by subcontractors or by the customer itself.

Overall, it would be desirable, therefore, to be able to determine and store the actual temperatures to which a semiconductor chip has been exposed during the soldering process, and in particular the associated temperature profiles.

U.S. Pat. No. 6,630,754 B1 describes a semiconductor arrangement in which a temperature sensor monitors a chip temperature and instigates a corresponding action when a threshold value is exceeded. During operation of a processor arranged on a circuit board, the operating temperature of said processor is determined and, when a threshold value is exceeded, by way of example a fan is activated or the clock frequency is reduced. The temperature is determined in analog fashion. A temperature signal is subsequently processed further by the processor. Voltage is supplied to the arrangement outside the processor.

In U.S. Pat. No. 5,444,637, the temperature on a semiconductor wafer during wafer processing is determined in order to monitor a fabrication process step. The semiconductor wafer has, inter alia, a processor and a battery and stores respective temperature values in a nonvolatile manner when a temperature threshold value is exceeded.

The stored temperature values can subsequently be read out. Voltage supply and signal processing and also temperature sensor are arranged at a distance from one another on the semiconductor wafer.

SUMMARY

The present invention is based on the object of providing an arrangement and also a method for determining a temperature loading during a soldering process.

According to the present invention, this object is achieved by means of an arrangement for determining a temperature loading of an integrated semiconductor chip, comprising: a semiconductor chip, which contains at least one contact to be soldered or is electrically conductively connected to at least one contact to be soldered that is situated outside the semiconductor chip, a temperature sensor device, which is coupled to the semiconductor chip and which is suitable for determining a measurement quantity that can be assigned to a temperature of the semiconductor chip, a processing device, which is integrated in the semiconductor chip and comprises an analog-to-digital converter, which is electrically conductively connected to the temperature sensor device and is suitable for converting the measurement quantity into at least one storable signal that represents the temperature loading, at least one voltage supply device, which is connected to the temperature sensor device and the processing device and which provides an operating voltage for the temperature sensor device and for the processing device, a data memory, which is integrated in the semiconductor chip and is connected to the processing device, for storing the at least one storable signal, a housing, in which the semiconductor chip, the temperature sensor device and the voltage supply device are arranged, and at least one electrical line connected to the data memory and serving for outputting the stored signal outside the housing.

The arrangement according to the invention thus comprises a semiconductor chip that stores the temperature loading during a soldering process at the contact to be soldered. If the arrangement is treated in the same way and is subjected to the same soldering process as a memory chip or a multiplicity of memory chips of a processing batch, the arrangement according to the invention experiences the same temperature loading.

The semiconductor chip is accommodated in a housing, in particular a housing that is customary for memory chips. In this case, it is electrically and thus thermally conductively connected to a contact to be soldered at the housing.

A temperature sensor device, which is suitable for determining a measurement quantity that can be unambiguously assigned to a temperature of the semiconductor chip, is furthermore provided. The temperature sensor device may be arranged at an arbitrary location of the semiconductor chip and, in particular, be integrated into the latter. However, it may also be adhesively bonded on the chip surface by means of a thermally conductive paste. The temperature sensor device may be designed for example in such a way that it determines a temperature-dependent voltage, for example the temperature-dependent threshold voltage of a diode or the threshold voltage of a MOSFET.

The analog-to-digital converter may be suitable for comparing the determined measurement quantity with a threshold value, for example a voltage threshold value, and for feeding a digital quantity corresponding to the result to the data memory.

In this case, by way of example, the exceeding of a set maximum temperature can be reliably determined in a particularly simple manner.

In accordance with a further embodiment of the present invention, the processing device, which is suitable for converting the measurement quantity into at least one storable signal that represents the temperature loading, furthermore comprises: a processor device, which is connected to the analog-to-digital converter and also a clock generator connected to the processor device and the analog-to-digital converter and serving for generating an operating clock, the analog-to-digital converter being suitable for converting a measurement quantity output by the temperature sensor device into a digital signal in accordance with the operating clock, and the processor device being suitable for converting a digital signal output by the analog-to-digital converter into a digital signal representing a temperature value and for generating a time signal representing the measurement instant and for feeding said time signal together with the signal representing the temperature value to the data memory.

This configuration of the invention makes it possible, in particular, to determine the temporal profile of the temperature occurring at the semiconductor chip, that is to say a temperature profile. Accordingly, the temperature loading can be determined particularly effectively since often what is responsible for impairing a component is, in particular, a high temperature that persists for a relatively long time rather than an individual peak temperature value. In particular, it is thereby possible to check whether a specification-conforming temperature profile has been used.

The arrangement according to the invention may furthermore comprise at least one signal line set, which is connected to the processor device and by which the arrangement for determining a temperature loading can be driven externally, the electrical line, for outputting the stored signal, being connected to the processor device.

As a result, the data stored in the data memory can be read out by driving the processor device and are available externally outside the arrangement.

According to the present invention, particular preference is attached to the fact that the processor device can be operated in at least one test mode. Provision is made of at least one programmable arrangement for storing an at least one test mode sequence.

As a result, specific temperature recording parameters, for example the temperature threshold value or the recording interval, can be programmed by a tester. As a result, the parameters of the temperature recording method can be varied individually in accordance with the external conditions, for example the soldering method used or the capacity of the data memory.

In particular, the processing device may be suitable for checking whether a signal output by the analog-to-digital converter exceeds a threshold value signal stored in the programmable memory device.

As a result, only those temperature values which exceed the set temperature threshold value are stored in the data memory. As a result, it becomes possible to operate the arrangement over a relatively long period of time even with a limited storage capacity of the data memory since only the data that are actually relevant are stored. By way of example, the arrangement according to the invention may be supplied to customers, the soldering temperature profile used by the customer being recorded as long as the soldering temperatures used there exceed the temperature threshold value. Furthermore, this embodiment ensures that only data that are actually relevant are stored and output afterward, thereby limiting the volume of data to be stored and to be processed afterward.

According to the present invention, the data memory and also the processing device and, if appropriate, the temperature sensor device is part of the semiconductor chip. The corresponding component may be monolithically integrated with the semiconductor chip.

In this case, if at least the component is integrated into the semiconductor chip, the latter can be realized in a particularly compact and space-saving manner. The arrangement according to the invention is preferably accommodated in a housing with a multiplicity of electrical terminals. At least one terminal is a contact to be soldered that is conductively connected to the semiconductor chip via an electrical line. The signal line set is connected to the chip via other terminals.

In particular, the arrangement according to the invention may be accommodated in a housing that is customarily used for memory chips, by way of example. This affords the advantage that the further processing conditions can be checked as realistically as possible and, in particular, the soldering profiles employed outside the sphere of influence of the semiconductor manufacturer can be practically checked. This may serve for better analyzability and subsequent fault-finding.

In the case of a method for determining a temperature loading of a soldering process applied to the contact of an arrangement according to the invention, the soldering process at the contact to be soldered and at the same time the following steps are carried out: (1) determining a measurement quantity that can be assigned to the temperature of the semiconductor chip, (2) converting the measurement quantity into a digital signal corresponding to the measurement quantity, (3) comparing the digital signal with a threshold value stored in the programmable memory device, (4) storing the digital signal together with a time signal, which specifies the measurement instant, in the data memory as long as the digital signal exceeds the threshold value, and (5) repeating steps (1) to (4).

The method makes it possible to record the temporal profile of the temperature prevailing at the semiconductor chip. Only those temperature values which exceed a temperature threshold value that can be set by means of a test mode are stored in this case.

According to the present invention, particular preference is attached to the fact that, after a storage process, the next digital signal is stored together with the time signal in the data memory only after a predetermined time interval.

As a result, it becomes possible to record data over a relatively long period of time even with a limited storage capacity.

BRIEF DESCRIPTION OF THE DRAWINGS

The present invention is explained in more detail below with reference to the accompanying drawings, in which.

DETAILED DESCRIPTION

Figure 1:
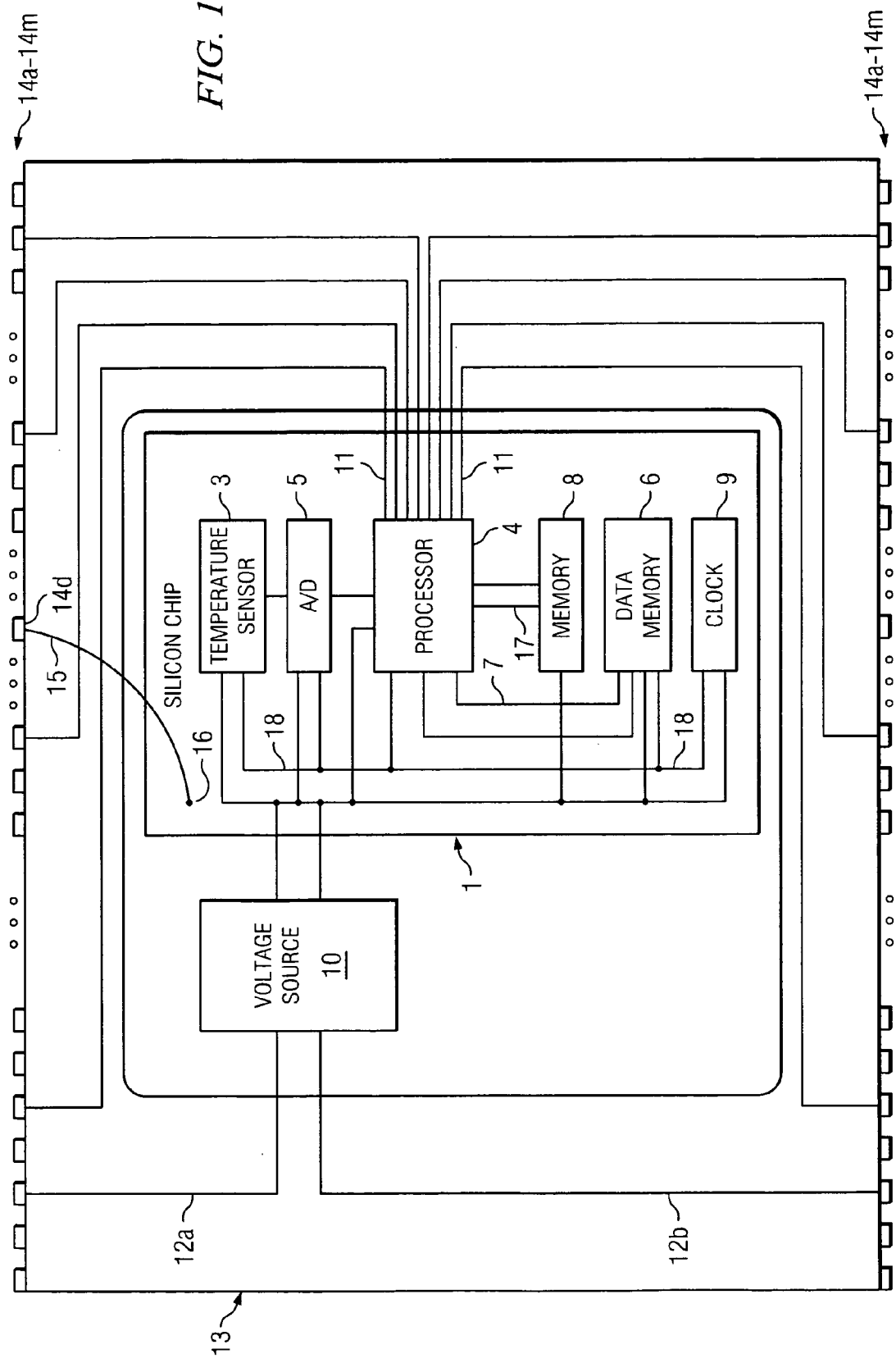
FIG. 1 shows a first exemplary embodiment of the present invention.

FIG. 1 shows a first exemplary embodiment of the present invention, in which the arrangement for determining a temperature loading during a soldering process is accommodated in a housing 13 that is customary for memory chips. Thus, the housing 13 has 54 terminals 14a to 14k in the case of the so-called TSOP54 housing and the TSOP66 housing has 66 terminals 14a to 14m, the allocation of which can be gathered from the associated data sheets.

The arrangement for determining a temperature loading comprises a silicon chip 1, which contains at least one electrical terminal pad region or terminal pad 16, which is electrically conductively connected to at least one contact 14d to be soldered on the chip housing via an electrical line 15, for example a bonding wire.

A temperature sensor device 3 is adhesively bonded on the semiconductor chip 1 by means of a thermally conductive paste. In the present case, the temperature sensor device 3 comprises a MOSFET and also a circuit for determining the threshold voltage of the MOSFET. In this case, the circuit and the MOSFET are designed in such a way that the circuit outputs a temperature-dependent voltage value. However, the temperature sensor device may also be realized in any other desired manner and, in particular, also comprise circuits with temperature-dependent resistance elements that are known per se.

Furthermore, an analog-to-digital converter 5, a processor 4, a clock generator 9 for generating an operating clock and also a memory device 8 for storing the test modes and a data memory 6 for storing the measured temperature value determined are arranged on the silicon chip 1. The data memory 6 is preferably nonvolatile, for example a flash or EEPROM memory, so that it stores data even without an external voltage supply device. These components may be adhesively bonded on the silicon chip or alternatively be integrated into the latter.

The clock generator 9 is connected to the rest of the components via a clock line 18. The processor 4 is connected to the data memory 6 via a first signal line set 7. The processor 4 is furthermore connected to suitable address, data and command terminals 14a to 14m of the housing via a second signal line set 11. Data are exchanged between the arrangement according to the invention and the outside world via said second set of signal lines 11. In other words, the arrangement according to the invention can be driven and output measurement data, for example, via the second set of signal lines 11. The processor 4 is connected to the memory device 8 via a third signal line 17.

The temperature sensor device 3, that is to say the circuit with the MOSFET, is connected to the voltage source 10 for supply with the required operating voltage.

In the present case, the voltage source 10 is rechargeable and connected via the lines 12a, 12b to the corresponding voltage supply terminals of the housing 13, for example to the supply voltage terminals $V_{DD}$, $V_{SS}$ of the housing in the case of a TSOP or BGA housing used at the present time. The voltage source 10 may likewise be adhesively bonded on the semiconductor chip 1 or alternatively be fitted to the semiconductor chip 1 at an arbitrary location.

By way of example, if the housing is now soldered onto a module board by soldering of a contact 14d, then the semiconductor chip experiences a temperature loading since it is thermally conductively connected to the contact 14d on the housing 13 via the electrical line 15. This temperature loading is identical to that experienced by a memory chip which is accommodated in an identical housing and is likewise soldered onto the circuit board. The temperature sensor device 3 outputs a quantity that can be unambiguously assigned to the temperature of the semiconductor chip, namely the temperature-dependent threshold voltage of the MOSFET.

This temperature-dependent threshold voltage is converted into a digital signal representing the temperature of the semiconductor chip in the analog-to-digital converter device S. Afterward, the digital signal is temporally continuously compared with a temperature threshold value in the processor 4 and, if it exceeds the temperature threshold value, is stored together with a value for the associated measurement instant in the data memory 6.

Figure 2:
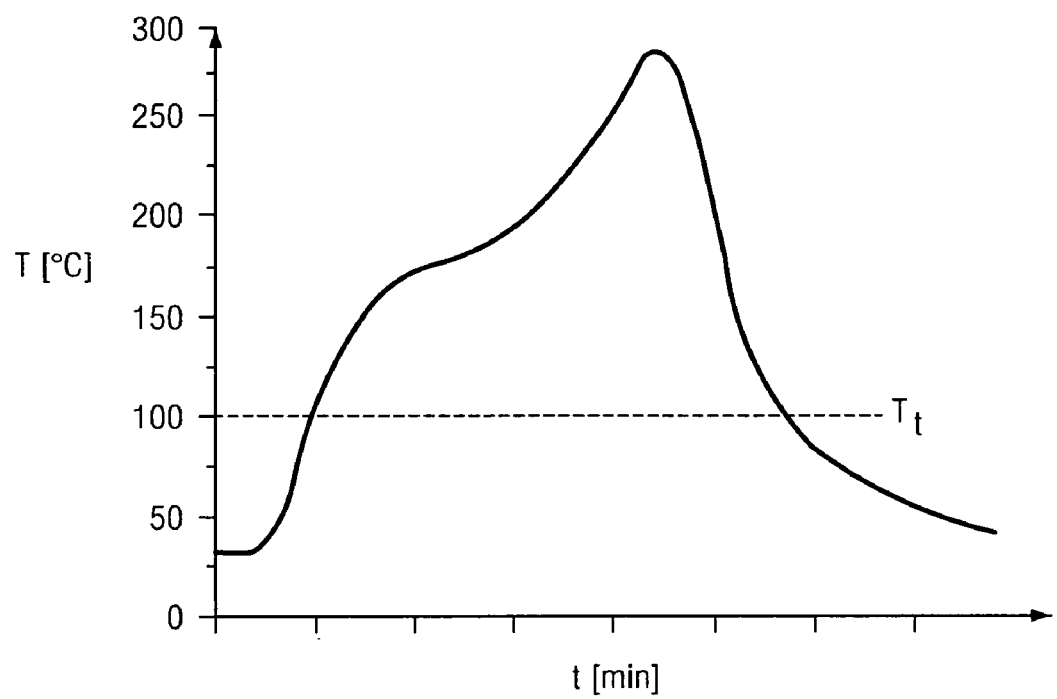
FIG. 2 shows an exemplary temperature profile during a soldering process.

FIG. 2 shows an exemplary view of a soldering profile in which the soldering temperature is plotted against the soldering time. Typical maximum values of the soldering temperatures are generally approximately 260° C. Typical soldering times are approximately 5 to 6 minutes.

According to the present invention, particular preference is attached to the fact that the temperature recording is not effected temporally continuously, but rather only takes place as soon as a threshold value set beforehand is exceeded. This ensures that only relevant temperature data, that is to say temperatures in proximity to the critical temperature for the memory chips, are recorded. As a result, the temperature recording process is optimized because the limited memory space of the data memory 6 is used only for data that are actually relevant.

Furthermore, according to the present invention, preference is attached to the fact that, after the set temperature threshold value has been exceeded, the temperature data are not stored continuously, but rather in time-discrete fashion spaced apart at defined time intervals, which permit a meaningful temperature profile.

If the temperature threshold value is undershot in the course of the soldering process, the storage of data is interrupted until the temperature threshold value is exceeded again.

The comparison of the measured temperature with the temperature threshold value is thus effected continuously in order to ensure that an exceeding of the temperature threshold value is reliably determined. After the temperature threshold value has been exceeded, however, the storage is effected in time-discrete fashion in defined time intervals that are stipulated in such a way that, on the one hand, the temperature fluctuations of interest are reliably determined, but also, on the other hand, the number of measurement points recorded is not too many and they do not unnecessarily take up the memory space of the data memory 6. The length of a time interval is thus selected in accordance with the size of the data memory and the desired temporal resolution.

According to the present invention, the temperature threshold value is preferably set by means of a test mode. The time intervals for storing the determined data may also be set by means of a test mode. Furthermore, the read-out and also the erasure of the data memory may be initiated by means of test modes.

Test modes are programs that are not normally accessible to the customary user and are only initiated if, by way of example, three key addresses defined beforehand are input via the corresponding address lines. On the basis of the key addresses input, the processor 4 recognizes that a test mode is activated, and which one, and retrieves the latter from the memory device 8. The memory device 8 is usually realized as hardware, that is to say that the test modes are implemented as circuit constituents, and the processor activates the associated circuit constituent when a test mode is addressed. However, the memory device 8 may also be a program memory from which the corresponding program sequence is read when a test mode is activated. The memory device 8 contains the control information in order to instigate and control the affected test mode.

After the addressing of the test mode for setting the temperature threshold value, the temperature threshold value can be input manually by an operator, for example via the data lines of the housed arrangement. The temperature threshold value, which is represented as $T_t$ in FIG. 2, is preferably selected in such a way that it exceeds the test temperatures to which memory chips are exposed during customary functional tests. By way of example, memory chips are subjected to a reliability test at 80° C. to 90° C. Accordingly, the temperature threshold value should be approximately 100° C.

The time interval for the data storage can also be set by means of a test mode in a corresponding manner.

The arrangement according to the invention is thus incorporated as a test chip in a housing like a regular memory chip with the aid of said test chip, it is then possible to record the temperature profile during the temperature stress in the course of further processing. The housing contains the test chip instead of a functional semiconductor memory chip. Since the housing contains the test chip with the arrangement for determining a temperature loading during a soldering process and not the memory chip expected by the customer, the chip returns as a customer return in the same way as the chips are returned as test fails or stacks from subcontractors.

After the return, the measured temperature values stored in the test chip are read out. Customary test systems are used to read out the measured temperature values. The read-out process is initiated by means of a test mode. The content of the data memory 6 is read out via the data lines, via the data or so-called DQ lines in the case of the TSOP or BGA housings used at the present time, of the second signal line set 11. In this case, the temperature resolution that can be achieved per read-out process depends on the number of data lines used and the read-out clock signals required for the read-out process.

After the read-out of the data memory 6, a further test mode may then be initiated, by way of example, by means of which the data in the memory are erased.

According to the present invention, the arrangement for determining a temperature loading during a soldering process may also be used for measuring temperature during soldering, the temperature/time data also being stored if the temperature threshold value is not exceeded.

In accordance with this exemplary embodiment, the arrangement according to the invention has all the components shown in FIG. 1 without the memory device 8 and the associated signal line 17. In this case, the processor does not have to be able to be operated in a test mode, and the second signal line set 11 is connected to the data memory 6. An external test system can directly access the data memory 6 via the signal line set 11.

Firstly, the data memory 6 is erased before the beginning of the soldering process by the external test system via the second signal line set 11. After disconnection of the electrical connection between test system and the second signal line set, the continuous recording of the measured temperature values together with the measurement instant begins.

After the end of the soldering process, the data memory 6 is read by the external test system via the second signal line set 11. Since only a limited recording duration is present in this case, the recording can be effected continuously and without a temperature threshold value.

Figure 3:
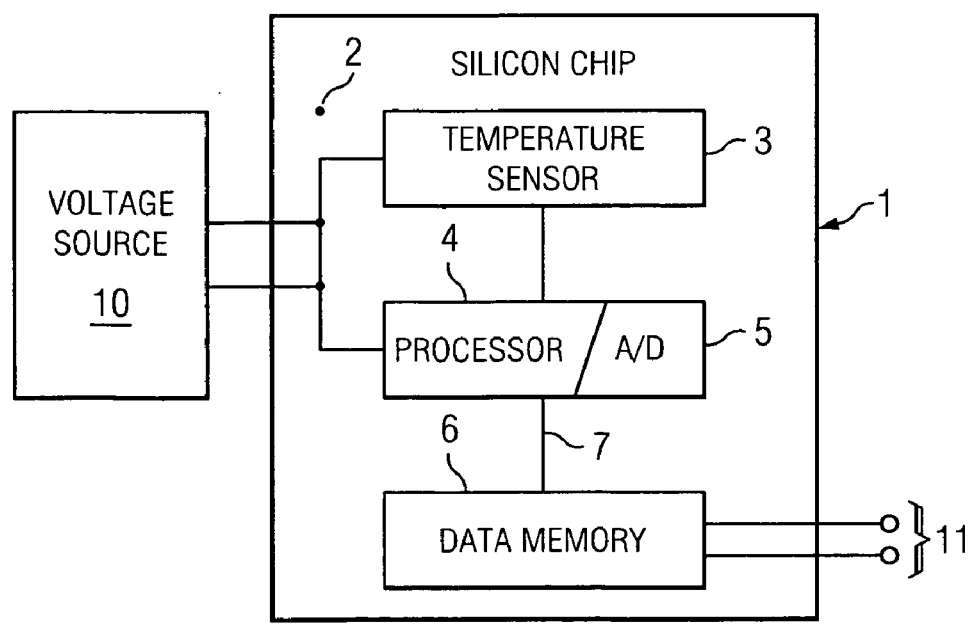
FIG. 3 shows a third exemplary embodiment of the present invention.

FIG. 3 shows a third, particularly simple exemplary embodiment of the present invention, in which the arrangement for determining a temperature loading during a soldering process is designed in such a way as merely to ascertain whether a predetermined maximum temperature is exceeded and to store the result in a memory.

As shown in FIG. 3, an unhoused semiconductor chip 1 contains a contact 2 to be soldered. A temperature sensor device 3 is integrated into the semiconductor chip 1. Furthermore, a processing device 4 with an analog-to-digital converter 5 are situated on the semiconductor chip 1. A data memory 6 is connected to the processing device 4 via a first signal line 7. Furthermore, a second signal line set 11 for external read-out of the data memory 6 is fitted to the data memory 6. A voltage source 1o is fitted laterally to the semiconductor chip 1. The analog-to-digital converter 5 is electrically conductively connected to the temperature sensor device 3.

The temperature sensor device may again be a temperature-sensitive semiconductor component, for example a diode or a field effect transistor, in particular MOS field effect transistor, with an associated circuit which outputs a measurement quantity corresponding to the temperature, in particular a voltage. The diode contains a pn junction, the threshold voltage of which is temperature-dependent. As the temperature rises or falls, the threshold voltage of the pn junction correspondingly decreases or increases. In the case of a field effect transistor, the gate-source threshold voltage is usually evaluated, which likewise varies as the temperature varies; the threshold voltage decreases as the temperature increases. There is a direct, unambiguous relationship between temperature and threshold voltage of diode or field effect transistor.

If a soldering process is carried out at the contact 2 to be soldered, then the semiconductor chip 1 is heated in exactly the same way as it would be heated if a regular memory chip were contained in the housing, the contact of which would be soldered by this soldering process. The accompanying increase in temperature is determined by the temperature sensor device 3, which passes a voltage signal corresponding to the temperature to the analog-to-digital converter 5. In the case of batch processing, a multiplicity of integrated circuits are processed in the same way; by way of example all the circuits of the batch are heated during a temperature treatment or the terminals of all the circuits of the batch are soldered and thereby heated. The test chip according to the invention is included in the batch and thereby processed, i.e. heated or soldered, in the same way as the rest of the semiconductor components of the batch. By virtue of the fact that the semiconductor chip according to the invention stores the temperature profile, there is therefore a good correlation between the temperature treatment which the semiconductor chip according to the invention has received and stored and the temperature treatment of the other components of the batch. By virtue of the fact that the stored temperature profile of the semiconductor chip according to the invention is read out, it can therefore be assumed with sufficient certainty that the other normal semiconductor components of the batch to be processed have also experienced a temperature treatment in accordance with said stored temperature profile.

In the case of this exemplary embodiment, the analog-to-digital converter 5 is embodied as a comparator that compares the voltage output by the temperature sensor device with a preset threshold value. As soon as the threshold value is exceeded, a corresponding bit is set in the data memory 6. Analog-to-digital converter 5 and data memory 6 are designed in such a way that this set bit can no longer be overwritten during subsequent temperature measurements. By reading the data memory via the signal line set 11 by means of an external test system, it can be identified whether the preset maximum temperature was exceeded during soldering.

As a result, it is possible to reliably identify a temperature loading that actually occurs at the semiconductor chip during the soldering process.

LIST OF REFERENCE SYMBOLS

1 Semiconductor chip
2 Contact to be soldered
3 Temperature sensor device
4 Processor
5 Analog-to-digital converter
6 Data memory
7 First signal line set
8 Memory device
9 Clock generator
10 Voltage source
11 Second signal line set
12a, 12b Current lines
13 Housing
14a–14m Terminals of the housing
14d Housing terminal to be soldered
15 Bonding wire
16 Electrical terminal
17 Third signal line set
18 Clock line
$T_t$ Temperature threshold value
20 Memory chip

The invention claimed is:

1. A method of making a semiconductor chip comprising selected circuitry, the method comprising:
performing a soldering operation to electrically connect a first one of at least two chip housings to at least one semiconductor chip and a second one of said at least two chip housings to at least one test semiconductor chip, wherein said semiconductor chip and said test semiconductor chip are heated during the soldering operation; and
at the same time that the soldering operating is being performed, storing on the semiconductor chip a temperature profile indicative of a temperature of the semiconductor chip, the temperature profile including a plurality of temperature measurements and time information.

2. The method of claim 1 wherein performing a soldering operation comprises soldering a contact of the semiconductor chip and the test semiconductor chip.

3. The method of claim 2, wherein the time information comprises a plurality of time values, each time value corresponding to one of the temperature measurements.

4. The method of claim 3, wherein the time values vary by a predetermined time interval.

5. The method of claim 2, further comprising measuring a temperature of the test semiconductor chip by a temperature sensor that is coupled to the test semiconductor chip, the plurality of temperature measurements being derived from the measured temperature.

6. The method of claim 5, wherein the temperature sensor provides analog temperature measurements, the method further comprising converting the analog temperature measurements to digital temperature measurements, wherein storing the temperature profile comprises storing the digital temperature measurements.

7. The method of claim 6, wherein converting the analog temperature measurements to digital temperature measurements comprises converting the analog temperature measurements to digital temperature measurements using an analog-to-digital converter that is integrated within the test semiconductor chip.

8. A method for determining a temperature loading of a soldering process applied to the contact of a semiconductor chip, the method comprising:
(a) providing a chip housing and an electrical conductor;
(b) providing a semiconductor chip arrangement that includes a temperature sensor coupled to the semiconductor chip, circuitry within the semiconductor chip being electrically coupled to a contact that is to be soldered;
(c) carrying out a soldering process to connect said electrical conductor between said chip housing and the contact to be soldered and simultaneously carrying out the following steps at least one time:
(d) determining a measurement quantity that can be assigned to the temperature of the semiconductor chip, the measurement quantity being determined by the temperature sensor;
(e) converting the measurement quantity into a digital signal corresponding to the measurement quantity;
(f) comparing the digital signal with a threshold value; and
(g) storing the digital signal together with a time signal, which specifies the measurement instant, as long as the digital signal exceeds the threshold value.

9. The method as claimed in claim 8, wherein the step of determining a measurement quantity comprises tapping off a signal from a diode or a field effect transistor and providing it at a terminal.

10. The method as claimed in claim 8, wherein converting the measurement quantity into a digital signal comprises converting the measurement quantity into the digital signal by means of an analog-to-digital converter.

11. The method as claimed in claim 10, wherein the analog-to-digital converter is integrated within the semiconductor chip.

12. The method as claimed in claim 8, wherein the semiconductor chip includes a programmable memory, wherein comparing the digital signal with a threshold value comprises comparing the digital signal with a threshold value stored in the programmable memory device, and wherein storing the digital signal together with the time signal comprises storing the digital signal together with the time signal in the programmable memory.

13. The method as claimed in claim 12, further comprising repeating steps (d) to (g) and then storing a next digital signal together with a next time signal in the data memory only after a predetermined time interval.

14. The method as claimed in claim 12, further comprising, in response to a read-out request, reading out the digital signal stored in the digital data memory and providing the digital signal at an output terminal of the semiconductor chip.

15. A method for determining a temperature loading of a soldering process applied to the contact of a semiconductor chip that includes selected circuitry coupled to a contact that is to be soldered, the method comprising:
(a) providing a test semiconductor chip that comprises at least a portion of said selected circuitry including said coupled contact that is to be soldered, said test semiconductor chip further comprising a temperature sensor coupled to the at least a portion of said selected circuitry on said test semiconductor chip;
(b) carrying out a soldering process at the contact to be soldered on said test semiconductor chip and simultaneously carrying out the following steps at least one time;
(c) determining a measurement quantity that can be assigned to the temperature of the semiconductor chip, the measurement quantity being determined by said temperature sensor on said test semiconductor chip;
(d) converting the measurement quantity into a digital signal corresponding to the measurement quantity;
(e) comparing the digital signal with a threshold value;
(f) storing the digital signal together with a time signal, which specifies the measurement instant, as long as the digital signal exceeds the threshold value.

16. The method as claimed in claim 15, wherein the step of determining a measurement quantity comprises tapping off a signal from a diode or a field effect transistor and providing it at a terminal.

17. The method of claim 15, wherein said test semiconductor chip comprises the same selected circuitry as said semiconductor chip plus said temperature sensor.

18. The method of claim 15, wherein said step of providing a test semiconductor chip comprises providing a plurality of said semiconductor chips along with said test semiconductor chip and wherein said step of carrying out a soldering process comprises carrying out said soldering process on said plurality of semiconductor chips and said test semiconductor chip.

19. The method of claim 15, wherein said steps of determining, connecting, comparing and storing are carried out a plurality of times and said semiconductor chip further comprises a memory for storing said plurality of digital signals and a processor.

20. The method as claimed in claim 15, wherein converting the measurement quantity into a digital signal comprises converting the measurement quantity into the digital signal by means of an analog-to-digital converter.

21. The method as claimed in claim 20, wherein the analog-to-digital converter is integrated within the test semiconductor chip.

22. The method as claimed in claim 15, wherein the test semiconductor chip includes a programmable memory, wherein comparing the digital signal with a threshold value comprises comparing the digital signal with a threshold value stored in the programmable memory, and wherein together with the time signal in the programmable memory.

23. The method as claimed in claim 22, further comprising repeating said steps (c) to (f) and then storing a next digital signal together with a next time signal in the data memory only after a predetermined time interval.

24. The method as claimed in claim 22, further comprising, in response to a read-out request, reading out the digital signal stored in the programmable memory and providing the digital signal at an output terminal of the test semiconductor chip.

* * * * *